United States Patent
Kim

(10) Patent No.: US 8,330,507 B2
(45) Date of Patent: Dec. 11, 2012

(54) DRIVING CONTROLLER AND INTERNAL VOLTAGE GENERATION CIRCUIT

(75) Inventor: Keun Kook Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 381 days.

(21) Appl. No.: 12/647,685

(22) Filed: Dec. 28, 2009

(65) Prior Publication Data

US 2010/0327839 A1 Dec. 30, 2010

(30) Foreign Application Priority Data

Jun. 26, 2009 (KR) .................. 10-2009-0057625

(51) Int. Cl.
*H03L 7/00* (2006.01)

(52) U.S. Cl. ..................... 327/143; 327/142

(58) Field of Classification Search .............. 327/142, 327/143, 198
See application file for complete search history.

(56) References Cited

U.S. PATENT DOCUMENTS

| 6,429,725 | B1 | 8/2002 | Tanzawa et al. | |
| 6,577,166 | B2* | 6/2003 | Lim | 327/77 |
| 6,744,295 | B2* | 6/2004 | Miyagi | 327/217 |
| 7,091,758 | B2* | 8/2006 | Chun et al. | 327/143 |
| 7,123,062 | B2* | 10/2006 | Do | 327/143 |
| 7,372,309 | B2* | 5/2008 | Ohtake | 327/142 |
| 7,675,331 | B2* | 3/2010 | Jung | 327/143 |

FOREIGN PATENT DOCUMENTS

KR 1020010059291 A 7/2001

* cited by examiner

*Primary Examiner* — Hai L Nguyen
(74) *Attorney, Agent, or Firm* — Ladas & Parry LLP

(57) ABSTRACT

A driving controller for use in stabilizing transient voltages from power supplies is presented. The driving controller includes a first pulse generator, a second pulse generator, and a control signal generator. The first pulse generator is configured to generate a power-up pulse signal including a pulse activating at a time of terminating a power-up period. The second pulse generator is configured to generate a detection pulse signal including a pulse that is being active from a time when an internal voltage reaches a predetermined level. The control signal generator is configured to generate an operation control signal, which controls a driving controller activating the internal voltage, in response to the power-up pulse signal and the detection pulse signal.

20 Claims, 6 Drawing Sheets

DRIVING CONTROLLER AND INTERNAL VOLTAGE GENERATION CIRCUIT

CROSS-REFERENCES TO RELATED PATENT APPLICATION

The present application claims priority under 35 U.S.C. 119(a) to Korean Application No. 10-2009-0057625, filed on Jun. 26, 2009, in the Korean Intellectual Property Office, which is incorporated herein by reference in its entirety as set forth in full.

BACKGROUND

This disclosure relates to driving controllers and internal voltage generation circuit.

Semiconductor memories generally use internal operation voltages made from power source voltages and ground voltages which are supplied from external systems. Such internal voltages are oftentimes core voltages supplied into core regions, high voltages for driving word lines or for overdriving, back bias voltages supplied into bulks of NMOS transistors of the core regions, and so on.

An internal voltage generation circuit usually comprises a standby driver for providing internal voltages in a standby mode, and an active driver for providing internal voltages in an active mode. The reason of additionally furnishing the standby driver to activate the internal voltages in the standby mode is for reducing power consumption by exclusively activating the standby driver, which can be driven in low power, in the standby mode during which there an operation of reading or writing is being substantially inactive.

FIGS. 1 and 2 show an initial operation of an internal voltage in a semiconductor memory apparatus.

As shown by voltage waveforms of FIG. 1, if the semiconductor memory apparatus begins to operate, an external power source voltage VDD initially starts low and rises to a working stable level. In a semiconductor memory apparatus using the external power source voltage VDD of 1.8V, a normal operation can be enabled when the external power source voltage VDD reaches 1.0 ~1.2V. Thus, a power-up signal PWRUP is generated to rises up to the same level with the external power source voltage VDD in a power-up period between time A0 to time A1. After the power-up period, the power-up signal PWRUP drops down to a low level. Accordingly, the semiconductor memory apparatus is set to start a normal operation after the power-up signal PWRUP transitions back to a low level. As also for an internal voltage VINT, the internal voltage VINT is driven to rise up along the external power source voltage VDD during the power-up period between times A0 to A1. During a period between times A1 to A2, after the power-up period, the internal voltage VINT is driven to rapidly rise up to a predetermined level by activation of an internal voltage generation circuit. That is, as shown by a waveform X in the graph of FIG. 2, when the external power source voltage VDD reaches about 1.0~1.2V in the condition with sufficient drivability for the internal voltage VINT, then the internal voltage VINT rapidly rises up to the predetermined level by operation of the internal voltage generation circuit.

However, since the semiconductor memory apparatus is still operating in the standby mode during the period from A1 to A2 even after the power-up period and a standby driver is being active alone in the internal voltage generation circuit, then insufficient drivability to the internal voltage VINT could happen to the semiconductor memory apparatus. In this case, as shown by waveforms Y and Z of FIG. 2, the internal voltage VINT is permitted to rise up to the predetermined level only when the external power source voltage VDD elevates to a level higher than 1.3V. If the drivability for the internal voltage VINT is insufficient, then a functional fail (i.e., malfunction) can occur since the internal voltage VINT is being held in a low level, which is incapable of immediately rising up to the predetermined level, even after the power-up period between A0~A1. Such a failure would be more conspicuous in a semiconductor memory apparatus where the power-up period is set at a relatively short time period.

SUMMARY

Accordingly, embodiments of the present invention are directed to a driving controller, and an internal voltage generation circuit including the driving controller, capable of substantially preventing a functional fail that is caused by insufficient drivability for an internal voltage by enhancing the drivability of the internal voltage as same as an active mode even after a power-up period.

In an embodiment of this disclosure, a driving controller may comprise a first pulse generator configured to generate a power-up pulse signal including a pulse activating at a time of terminating a power-up period, a second pulse generator configured to generate a detection pulse signal including a pulse that is being active from a time when an internal voltage reaches a predetermined level, and a control signal generator configured to generate an operation control signal, which controls a driving controller activating the internal voltage, in response to the power-up pulse signal and the detection pulse signal.

In embodiments, a driving controller may comprise a pulse generator configured to generate a detection pulse signal including a pulse that is activated at a time when an internal voltage reaches a predetermined level and a control signal generator configured to generate an operation control signal, which controls a driving controller activating the internal voltage, in response to a power-up signal and the detection pulse signal.

In another embodiment of this disclosure, an internal voltage generation circuit may comprise a driving controller configured to generate an operation control signal that is being active from a time of terminating a power-up period; and a first driver configured to drive the internal voltage in response to the operation control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF EMBODIMENTS

Hereinafter, various embodiments will now be described more fully with reference to the accompanying drawings in which some embodiments are shown. However, specific structural and functional details disclosed herein are merely representative for purposes of describing embodiments of the present invention. Like numbers refer to like elements throughout the description of the drawings.

The terminology used herein is for the purpose of describing particular embodiments only and is not intended to be limiting of embodiments. As used herein, the singular forms "a," "an" and "the" are intended to comprise the plural forms as well, unless the context clearly indicates otherwise. It will be further understood that the terms "comprises," "comprising," "comprises" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention.

In order to more specifically describe embodiments, various aspects will be hereinafter described in detail with reference to the attached drawings.

Figure 1:
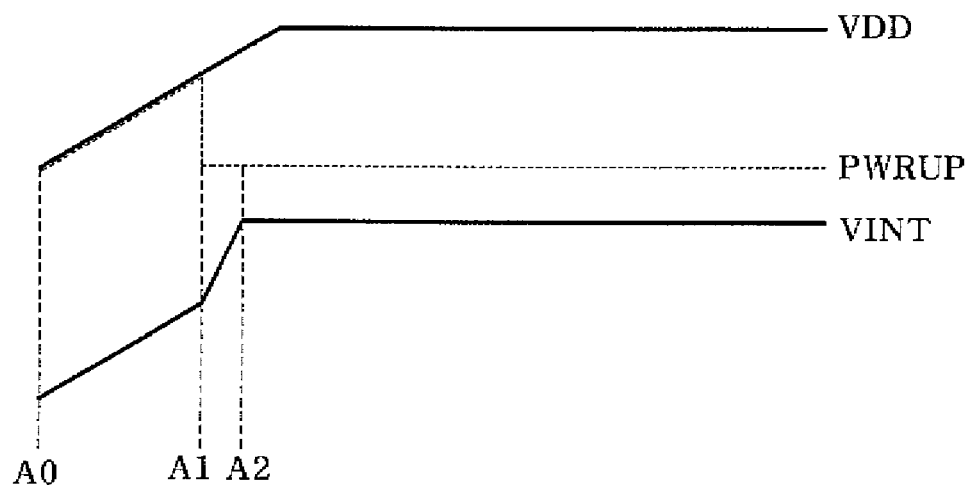
FIGS. 1 and 2 are waveform diagrams showing an initial operation of an internal voltage in a semiconductor memory apparatus.
Figure 2:
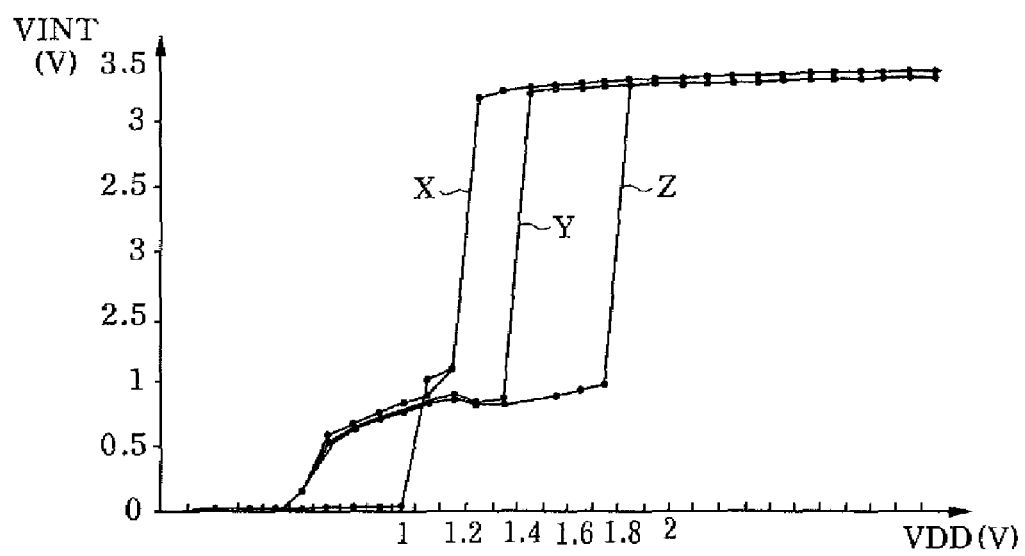
Figure 3:
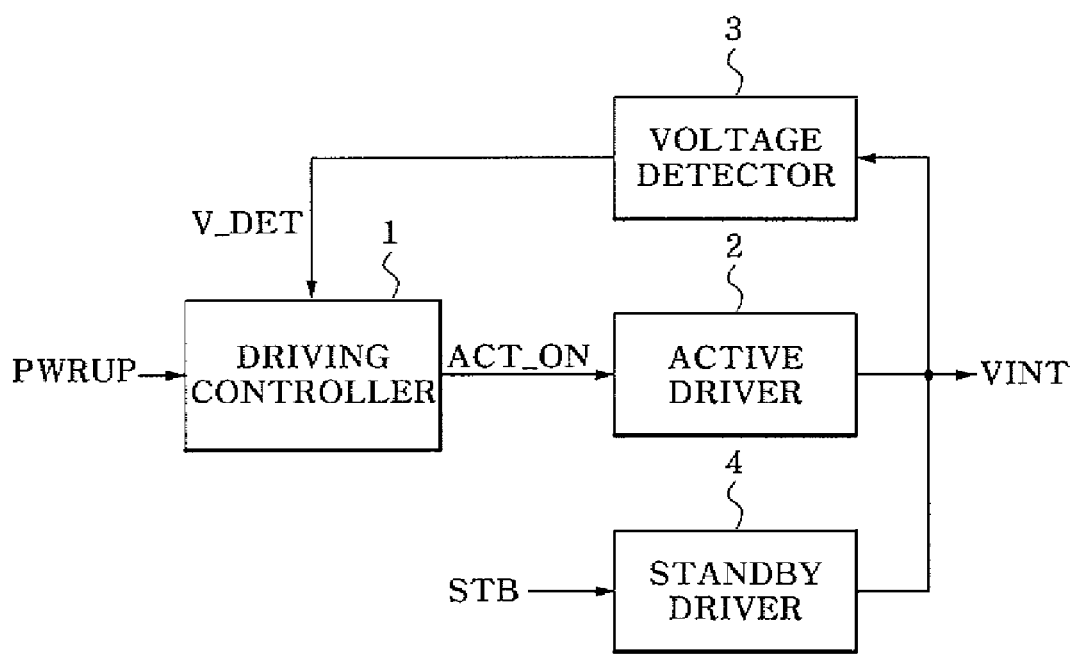
FIG. 3 is a block diagram illustrating an organization of an internal voltage generation circuit according to an embodiment of the present invention.
Figure 4:
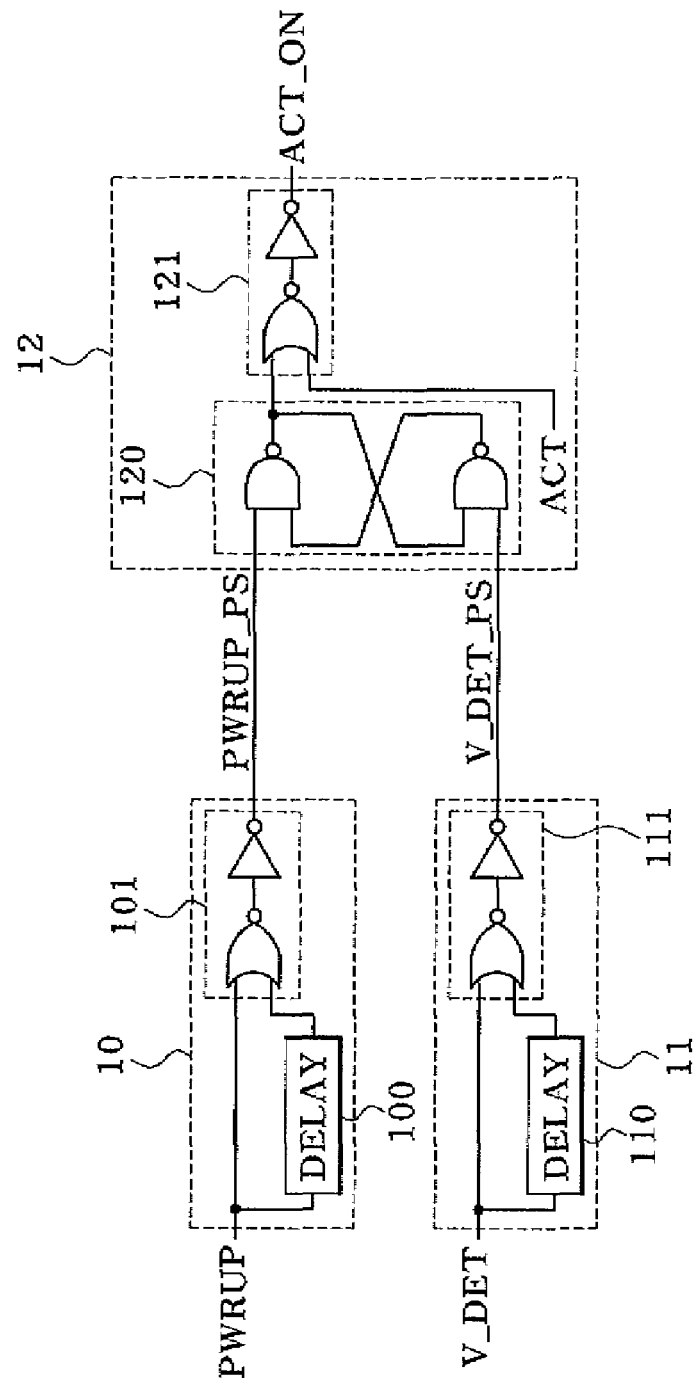
FIG. 4 is a circuit diagram illustrating a first embodiment of the driving controller comprised in the internal voltage generation circuit shown in FIG. 3.

FIG. 3 illustrates an organization of an internal voltage generation circuit according to an embodiment of the present invention and FIG. 4 illustrates a first embodiment of the driving controller comprised in the internal voltage generation circuit shown in FIG. 3.

Referring to FIG. 3, the internal voltage generation circuit is shown comprising a driving controller 1, an active driver 2, a voltage detector 3 and a standby driver 4.

Referring to FIG. 4, the driving controller 1 is exemplarily composed of a first pulse generator 10, a second pulse generator 11 and a first control signal generator 12.

The first pulse generator 10 comprises a delay circuit 100 configured to delay a power-up signal PWRUP for a predetermined time, and a logic circuit 101 configured to execute an OR operation with the power-up signal PWRUP and an output signal of the delay circuit 100. The power-up signal PWRUP rises up to the same level with an external power source voltage VDD in a power-up period and falls down to a low level after the power-up period. With this configuration, the first pulse generator 10 operates to generate a power-up pulse signal PWRUP_PS that comprises a pulse which is in an active mode at a low level from an end of the power-up period until the termination of delay by the delay circuit 100.

The second pulse generator 11 comprises a delay circuit 110 configured to delay a detection signal V_DET, and a logic circuit 111 configured to execute an OR operation with the detection signal V_DET and an output signal of the delay circuit 110. The detection signal V_DET transitions to a low level from a high level when an internal voltage VINT reaches a predetermined level. With this configuration, the second pulse generator 11 operates to generate a detection pulse signal V_DET_PS that comprises a pulse which is in an active mode when in a low level from when the internal voltage VINT reaches the predetermined level until the termination of delay by the delay circuit 110.

The first control signal generator 12 comprises an SR latch 120 configured to receive the power-up pulse signal PWRUP_RS as a set signal and configured to receive the detection pulse signal V_DET_PS as a reset signal, and a logic circuit 121 configured to execute an OR operation with an output signal of the SR latch 120 and an active signal ACT that is activated in a high level during an active mode. With this configuration, the first control signal generator 12 operates to generate an operation control signal ACT_ON that is in an active mode from when a low level pulse of the power-up pulse signal PWRUP_PS is applied thereto until when a low level pulse of the detection pulse signal V_DET_PS is applied thereto. The operation control signal ACT_ON is activated in a high level during the active mode.

The active driver 2 operates to drive the internal voltage VINT if the operation control signal ACT_ON is applied thereto in a high level. That is, the active driver 2 operates to drive the internal voltage VINT until the internal voltage VINT arrives at the predetermined level even after the power-up period, as well as operating in the active mode. The active driver 2 may be implemented by a general driving circuit capable of driving the internal voltage VINT in the active mode.

The voltage detector 3 is configured to generate a detection signal V_DET by sensing a level of the internal voltage VINT. The detection signal V_DET is generated in a high level when the internal voltage VINT is lower than the predetermined level (this is variable by use), or the detection signal V_DET is generated in a low level when the internal voltage VINT is higher than the predetermined level.

The standby driver 4 is configured to drive the internal voltage VINT in response to a standby signal STB that is activated in a high level during a standby mode. The standby driver 4 is configured to activate the internal voltage VINT with smaller drivability than the active driver 2 so as to reduce power consumption in the standby mode.

Figure 5:
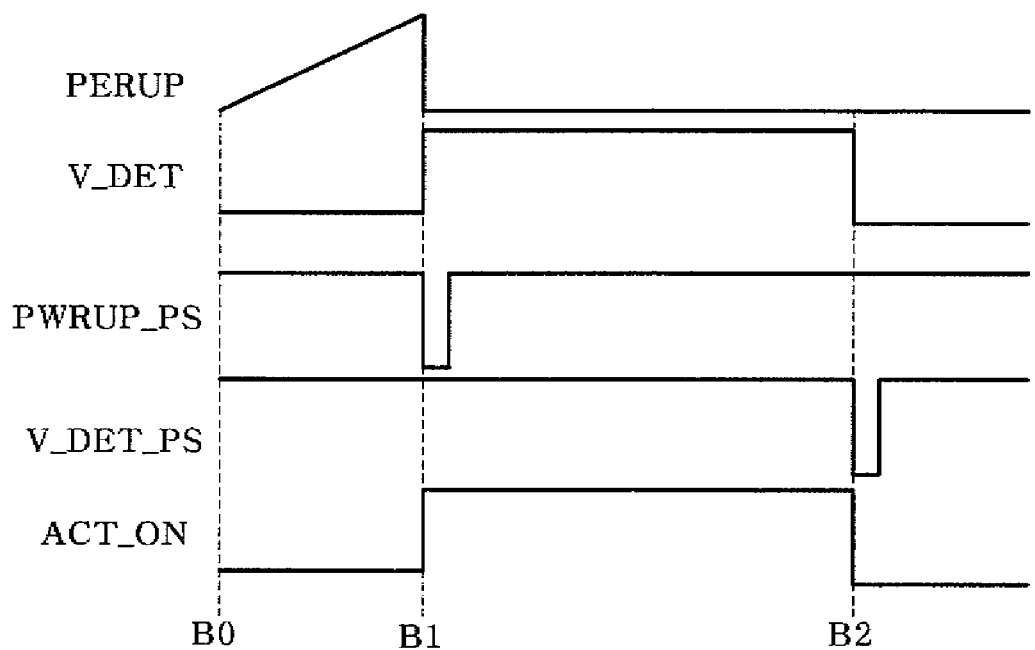
FIG. 5 is a timing diagram showing an operation of the internal voltage generation circuit shown in FIG. 3.

Now an operation of the internal voltage generation circuit will be described hereinafter in conjunction with FIG. 5.

At a time B1 of terminating the power-up period B0~B1, the semiconductor memory apparatus is still operating in the standby mode. Then, the active signal ACT goes to a low level and the standby signal STB goes to a low level, so the standby driver 4 operates to drive the internal voltage VINT.

During this, as the power-up signal PWRUP goes to a low level from a high level in response to the termination of the power-up period, the first pulse generator 10 of the driving controller 1 then generates the power-up pulse signal PWRUP_PS that is being in a low level from the end of the power-up period until a delay period of the delay circuit 100 is terminated.

Then, the first control signal generator 12 receiving the low level pulse of the power-up pulse signal PWRUP_PS is configured to generate the operation control signal ACT_ON of high level to enable the active driver 2.

Afterward, at a time B2 when the internal voltage VINT reaches the predetermined level by operations of the standby and active drivers 4 and 2, the voltage detector 3 is configured to make the detection signal V_DET transition to a low level from a high level. Responding to the detection signal V_DET of low level, the detection pulse signal V_DET_PS from the second pulse generator 11 is being active in a low level from the time B2 when the internal voltage VINT reaches the predetermined level until a delay period of the delay circuit 110 is terminated. Thus, the first control signal generator 12 is configured to inactivate the operation control signal ACT_ON and disables the active driver 2.

As aforementioned, the internal voltage generation circuit according to embodiments enables the internal voltage VINT to be driven by the active driver 2, as well as by the standby driver 4, at the time of terminating the power-up period. As a result, a functional failure caused by insufficient drivability for the internal voltage VINT can be substantially removed.

Figure 6:
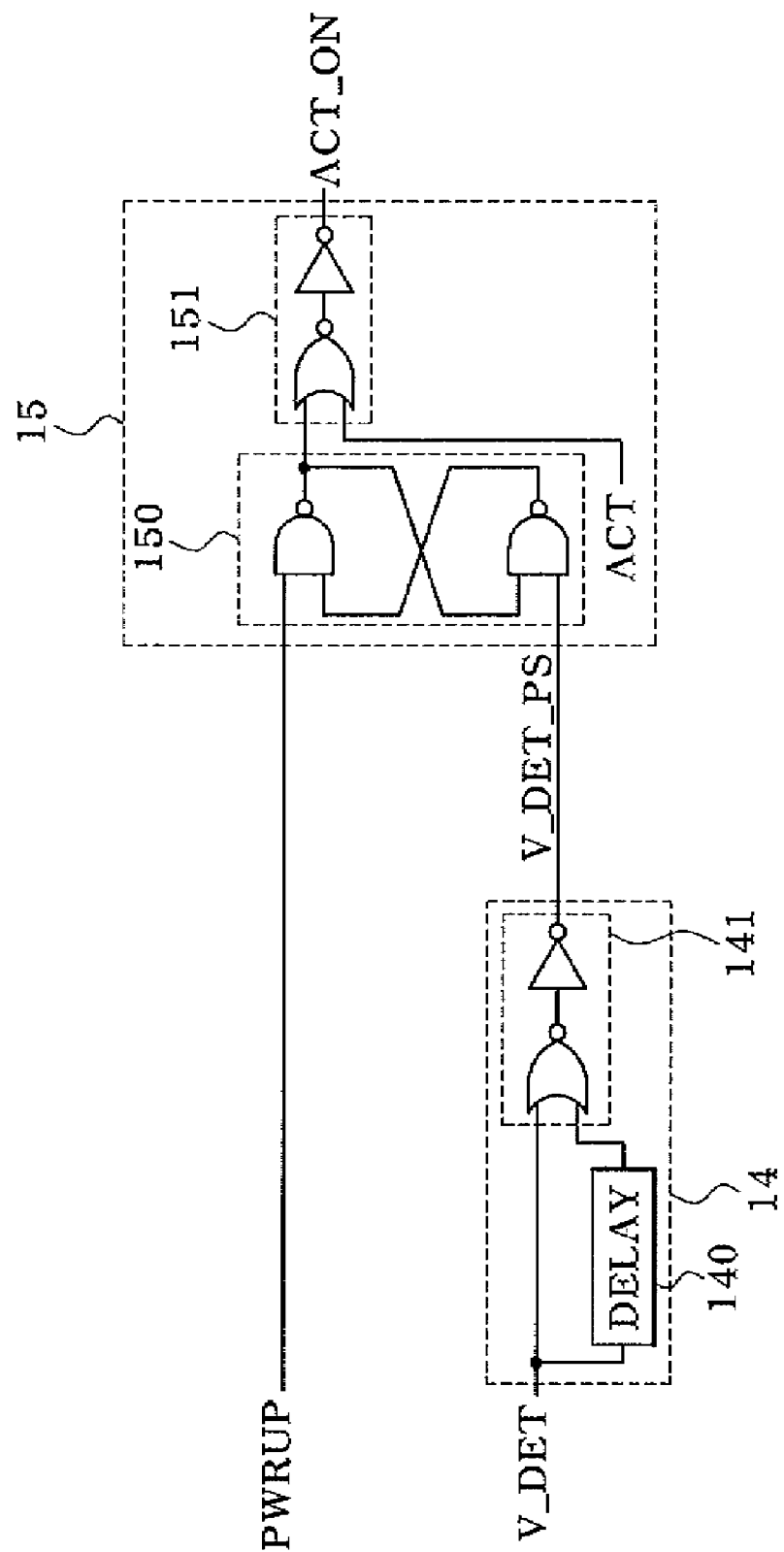
FIG. 6 is a circuit diagram illustrating a second embodiment of the driving controller comprised in the internal voltage generation circuit shown in FIG. 3.

FIG. 6 illustrates a second embodiment of the driving controller comprised in the internal voltage generation circuit shown in FIG. 3.

As shown in FIG. 6, the driving controller 1 according to the second embodiment is organized of a third pulse generator 14 and a second control signal generator 15.

The third pulse generator 14 is composed of a delay circuit 140 configured to delay the detection signal V_DET in a predetermined time, and a logic circuit 141 configured to execute an OR operation with the detection signal V_DET and an output signal of the delay circuit 140. With this configuration, the third pulse generator 14 is configured to generate the detection pulse signal V_DET_PS that is being active in a low level from the time when the internal voltage VINT reaches the predetermined level until the delay period of the delay circuit 140.

The second control signal generator 15 can comprise an SR latch 150 configured to receive the power-up signal PWRUP as a set signal and configured to receive the detection pulse signal V_DET_PS as a reset signal, and a logic circuit 151 configured to execute an OR operation with an output signal of the SR latch 120 and the active signal ACT that is activated in a high level during the active mode. With this configuration, the second control signal generator 15 is configured to generate the operation control signal ACT_ON that is being active from when the power-up signal PWRUP_PS goes to a low level until when a low level pulse of the detection pulse signal V_DET_PS is applied thereto.

As described above, the driving controller 1 is configured to enable the active driver 2 along with the standby driver 4 by generating the operation control signal ACT_ON that is being active from the end of the power-up period until the time when the internal voltage VINT reaches the predetermined level.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be comprised within the scope of this invention as defined in the claims.

What is claimed is:

1. A driving controller, comprising:
a first pulse generator configured to generate a power-up pulse signal which includes a pulse that is being active from an end of terminating a power-up period until a termination of a first delay;
a second pulse generator configured to generate a detection pulse signal which includes a pulse that is being active from a time when an internal voltage reaches a predetermined level until a termination of a second delay; and
a control signal generator configured to generate an operation control signal, which controls a driving controller which activates the internal voltage, in response to the power-up pulse signal and the detection pulse signal.

2. The driving controller according to claim 1, wherein the first pulse generator comprises:
a delay circuit configured to delay a power-up signal for the first delay; and
a logic circuit configured to generate the power-up pulse signal through a logical operation with the power-up signal and configured to generate an output signal of the delay circuit.

3. The driving controller according to claim 1, wherein the second pulse generator comprises:
a delay circuit configured to delay the detection pulse signal for time the second delay; and
a logic circuit configured to transmit the detection pulse signal through a logical operation with the detection signal and configured to output an output signal of the delay circuit.

4. The driving controller according to claim 1, wherein the control signal generator comprises:
a latch configured to latch the power-up pulse signal and the detection pulse signal; and
a logic circuit configured to generate the operation control signal through a logical operation with an active signal and an output signal of the latch.

5. The driving controller according to claim 4, wherein an output signal of the latch is activated when the power-up pulse signal is activated, and inactivated when the detection pulse signal is activated.

6. The driving controller according to claim 5, wherein the logic circuit generates the operation control signal that is activated when one of the active signal and the output signal of the latch is activated.

7. A driving controller, comprising:
a pulse generator configured to generate a detection pulse signal which includes a pulse that is active from a time when an internal voltage reaches a predetermined level until a termination of a predetermined delay; and
a control signal generator configured to generate an operation control signal, which controls a driving controller activating the internal voltage, in response to a power-up signal and the detection pulse signal.

8. The driving controller according to claim 7, the pulse generator comprises:
a delay circuit configured to delay a detection signal for time the predetermined delay; and
a logic circuit configured to transmit the detection pulse signal through a logical operation with the detection signal and configured to output an output signal of the delay circuit.

9. The driving controller according to claim 7, wherein the control signal generator comprises:
a latch configured to input and latch the power-up pulse signal and the detection pulse signal; and
a logic circuit configured to generate the operation control signal through a logical operation with an active signal and configured to output an output signal of the latch.

10. The driving controller according to claim 9, wherein the output signal of the latch is activated when the power-up pulse signal is activated, and the output signal of the latch is inactivated when the detection pulse signal is activated.

11. The driving controller according to claim 10, wherein the logic circuit is configured to generate the operation control signal that is activated when one of the active signal and the output signal of the latch is activated.

12. An internal voltage generation circuit, comprising:
a driving controller configured to generate an operation control signal that is being active in response to a power-up pulse signal and a detection pulse signal; and
a first driver configured to drive an internal voltage in response to the operation control signal, wherein the power-up pulse signal includes a pulse that is being active from an end of terminating a power-up period until a termination of a first delay, and the detection pulse signal includes a pulse that is being active from a time when an internal voltage reaches a predetermined level until a termination of a second delay.

13. The internal voltage generation circuit according to claim 12, further comprising a voltage detector configured to generate a detection signal when the internal voltage reaches the predetermined level.

14. The internal voltage generation circuit according to claim 13, wherein the driving controller comprises:
    a first pulse generator configured to generate the power-up pulse signal in response to a power-up pulse signal;
    a second pulse generator configured to generate the detection pulse signal in response to a power-up pulse signal; and
    a control signal generator configured to generate the operation control signal, which controls the first driver activating the internal voltage, in response to the power-up pulse signal and the detection pulse signal.

15. The internal voltage generation circuit according to claim 14, wherein the first pulse generator comprises:
    a delay circuit configured to generate the power-up pulse signal for the first delay; and
    a logic circuit configured to generate the power-up pulse signal through a logical operation with the power-up signal and an output signal of the delay circuit.

16. The internal voltage generation circuit according to claim 14, wherein the second pulse generator comprises:
    a delay circuit configured to delay the detection signal for the second delay; and
    a logic circuit configured to the detection pulse signal through a logical operation with the detection signal and an output signal of the delay circuit.

17. The internal voltage generation circuit according to claim 14, wherein the control signal generator comprises:
    a latch configured to latch the power-up pulse signal and the detection pulse signal; and
    a logic circuit configured to generate the operation control signal through a logical operation with an active signal and an output signal of the latch.

18. The internal voltage generation circuit according to claim 17, wherein an output signal of the latch is activated when the power-up pulse signal is activated, and the output signal of the latch is inactivated when the detection pulse signal is activated.

19. The internal voltage generation circuit according to claim 18, wherein the logic circuit generates the operation control signal that is activated when one of the active signal and the output signal of the latch is activated.

20. An internal voltage generation circuit comprising:
    a driving controller configured to generate an operation control signal that is being active in response to a power-up signal and a detection pulse signal
    a first driver configured to drive an internal voltage in response to the operation control signal, wherein the power-up signal is being active from an end of terminating a power-up period, and the detection pulse signal includes a pulse that is being active from a time when an internal voltage reaches a predetermined level until a termination of a second delay.

* * * * *